(12) United States Patent
Sato et al.

(10) Patent No.: US 9,899,963 B2
(45) Date of Patent: Feb. 20, 2018

(54) POWER AMPLIFICATION MODULE

(71) Applicant: Murata Manufacturing Co., Ltd., Kyoto (JP)

(72) Inventors: Tsuyoshi Sato, Kyoto (JP); Kiichiro Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/079,960

(22) Filed: Mar. 24, 2016

(65) Prior Publication Data

US 2016/0301366 A1    Oct. 13, 2016

(30) Foreign Application Priority Data

Apr. 13, 2015  (JP) .................................. 2015-082069
Nov. 17, 2015  (JP) .................................. 2015-224869

(51) Int. Cl.

| H03K 5/22 | (2006.01) |
|---|---|
| H03F 1/26 | (2006.01) |
| H03F 3/19 | (2006.01) |
| H03F 1/02 | (2006.01) |
| H03F 3/24 | (2006.01) |
| H03F 3/68 | (2006.01) |

(52) U.S. Cl.
CPC ............ *H03F 1/26* (2013.01); *H03F 1/0222* (2013.01); *H03F 1/0227* (2013.01); *H03F 3/19* (2013.01); *H03F 3/245* (2013.01); *H03F 3/68* (2013.01); *H03F 2200/102* (2013.01); *H03F 2200/105* (2013.01); *H03F 2200/451* (2013.01)

(58) Field of Classification Search
None
See application file for complete search history.

(56) References Cited

U.S. PATENT DOCUMENTS

| 7,330,071 B1* | 2/2008 | Dening ................. H03F 1/0288 330/124 R |
|---|---|---|
| 2005/0151586 A1 | 7/2005 | Grillo |
| 2012/0146731 A1* | 6/2012 | Khesbak ............... H03F 1/0222 330/295 |
| 2013/0207731 A1* | 8/2013 | Balteanu ................... H03F 1/02 330/296 |
| 2013/0217345 A1* | 8/2013 | Balteanu ................... H03F 1/02 455/84 |

FOREIGN PATENT DOCUMENTS

| JP | 2003-218708 A | 7/2003 |
|---|---|---|
| JP | 2005-513943 A | 5/2005 |
| JP | 2006-094424 A | 4/2006 |
| JP | 2010-068481 A | 3/2010 |

* cited by examiner

*Primary Examiner* — Long Nguyen
(74) *Attorney, Agent, or Firm* — Pearne & Gordon LLP

(57) ABSTRACT

Provided is a power amplification module that includes: a first power amplifier that amplifies a first signal and outputs a second signal; and a first noise removing circuit that is inputted with a first voltage supplied from a DC-DC converter, removes noise from the first voltage in order to generate a second voltage, and outputs the second voltage as a power supply voltage of the first power amplifier.

10 Claims, 16 Drawing Sheets

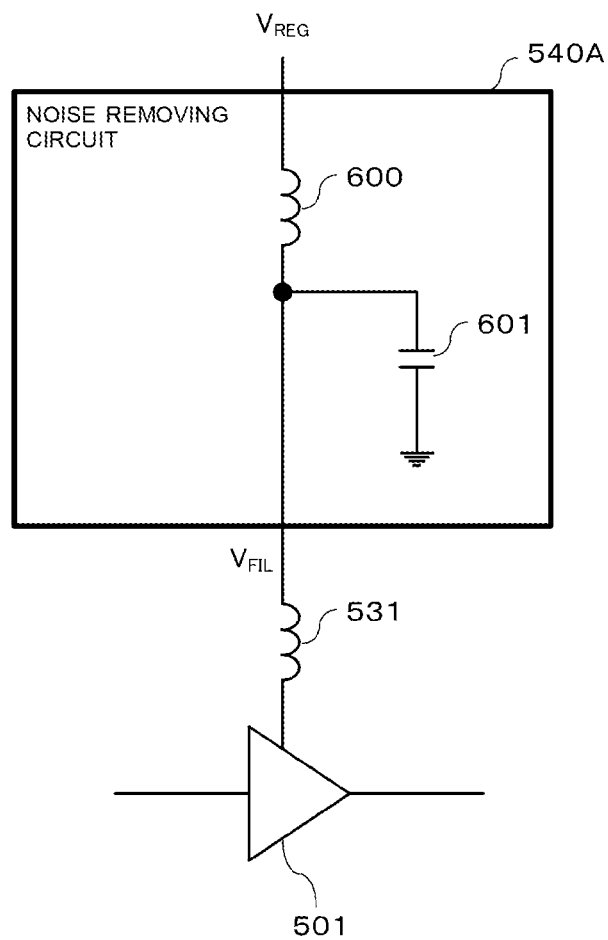

POWER AMPLIFICATION MODULE

BACKGROUND OF THE DISCLOSURE

1. Field of the Disclosure

The present disclosure relates to a power amplification module.

2. Description of the Related Art

A power amplification module is used in a mobile communication device such as a cellular phone in order to amplify the power of a signal to be transmitted to a base station. In recent years, modulation schemes such as high-speed uplink packet access (HSUPA), long term evolution (LTE) and LTE-Advanced, which are high-speed data communication standards, have been adopted in cellular phones. In these communication standards, it is important that shifting and distortion of phase and amplitude be made small in order to improve the communication speed. In other words, high linearity is demanded for a power amplification module. In addition, in these communication standards, the range over which the amplitude of a signal changes (the dynamic range) is often widened in order to improve the communication speed. A high power supply voltage is necessary in order to achieve high linearity in the case of a large dynamic range and the power consumption of the power amplification module tends to be high.

On the other hand, it is demanded that power consumption be reduced in cellular phones in order to lengthen the amount of time for which telephone calls and communications can be performed. In Japanese Unexamined Patent Application Publication (Translation of PCT Application) No. 2005-513943 for example, a power amplification module is disclosed in which an envelope tracking (ET) scheme is adopted that improves power efficiency by controlling the power supply voltage in accordance with the amplitude level of an input-modulated signal. In addition, a power amplification module is also known in which an average power tracking (APT) scheme is adopted that controls the power supply voltage in accordance with the average output power.

In such power amplification modules that employ the envelope tracking scheme or the average power tracking scheme, a DC-DC converter is used in order to change the power supply voltage. Consequently, the reception band noise characteristics of the power amplification module may be degraded due to noise output from the power supply circuit at the time of the envelope tracking operation or the average power tracking operation.

BRIEF SUMMARY OF THE DISCLOSURE

The present disclosure was made in light of such circumstances and it is an object thereof to suppress the deterioration of reception band noise characteristics in a power amplification module that employs a power supply voltage supplied from a DC-DC converter.

A power amplification module according to a preferred embodiment of the present disclosure includes: a first power amplifier that amplifies a first signal and outputs a second signal; and a first noise removing circuit that is inputted with a first voltage supplied from a DC-DC converter, removes noise from the first voltage in order to generate a second voltage, and outputs the second voltage as a power supply voltage of the first power amplifier.

According to the preferred embodiment of the present disclosure, the deterioration of reception band noise characteristics can be suppressed in a power amplification module that employs a power supply voltage supplied from a DC-DC converter.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 6A illustrates an example configuration of a noise removing circuit;

DETAILED DESCRIPTION OF THE DISCLOSURE

Figure 1:
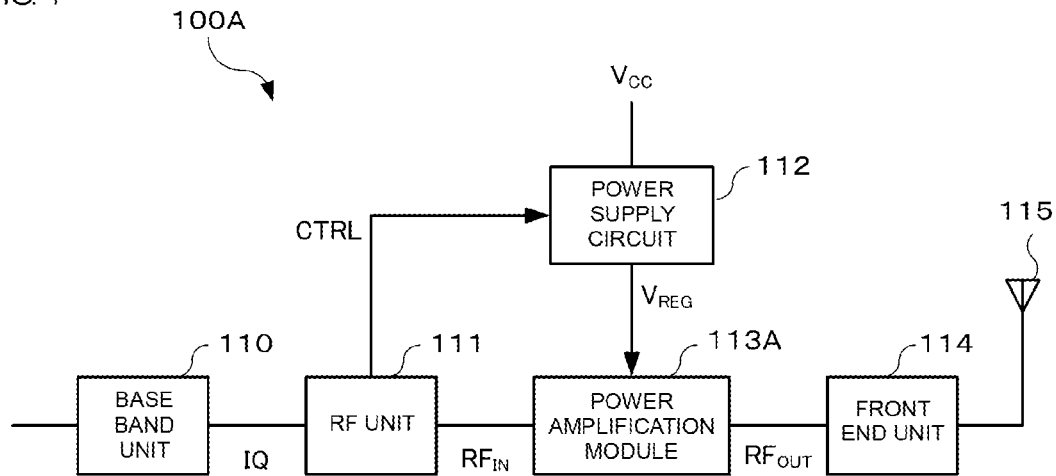
FIG. 1 illustrates an example configuration of a transmission unit that includes a power amplification module according to an embodiment of the present disclosure.

Hereafter, an embodiment of the present disclosure will be described while referring to the drawings. FIG. 1 illustrates an example configuration of a transmission unit that includes a power amplification module according to an embodiment of the present disclosure. A transmission unit 100A is for example used in a mobile communication device such as a cellular phone in order to transmit various signals such as speech and data to a base station. The transmission unit 100A of this embodiment supports a plurality of frequency bands (multiple bands) among radio frequencies (RF). Although a mobile communication device would also be equipped with a reception unit for receiving signals from the base station, the description of such a reception unit is omitted here.

As illustrated in FIG. 1, the transmission unit 100A includes a base band unit 110, an RF unit 111, a power supply circuit 112, a power amplification module 113A, a front end unit 114 and an antenna 115. Although the power amplification module 113A will be described in this embodiment as a power amplification module in which an envelope tracking scheme is employed, the power amplification module 113A may instead be a power amplification module of another scheme in which the power supply voltage varies such as average power tracking scheme. The same also applies to a power amplification module 113B described later.

The base band unit 110 modulates an input signal such as speech or data on the basis of a modulation scheme such as HSUPA or LTE and outputs a modulated signal. In this embodiment, the modulated signal output from the base band unit 110 is output as IQ signals (I signal and Q signal) in which the amplitude and the phase are represented on an IQ plane. The frequencies of the IQ signals are on the order of several MHz to several tens of MHz, for example.

The RF unit 111 generates an RF signal ($RF_{IN}$), which is for performing wireless transmission, from the IQ signals output from the base band unit 110. The RF signal has a frequency of around several hundred MHz to several GHz, for example. In addition, the RF unit 111 detects the amplitude level of the modulated signal on the basis of the IQ signals and outputs a power supply control signal CTRL to the power supply circuit 112 so that a voltage $V_{REG}$ supplied to the power amplification module 113A has a level that corresponds to the amplitude level of the RF signal. In other words, the RF unit 111 outputs the power supply control signal CTRL in order to perform envelope tracking.

In the RF unit 111, the IQ signals may be converted into an intermediate frequency (IF) signal and an RF signal may be then generated from the IF signal, instead of directly converting the IQ signals into the RF signal.

The power supply circuit 112 generates a power supply voltage $V_{REG}$ of a level that corresponds to the power supply control signal CTRL output from the RF unit 111 and supplies the generated power supply voltage $V_{REG}$ to the power amplification module 113A. The power supply circuit 112 can, for example, include a DC-DC converter (step up or step down converter) that generates a voltage $V_{REG}$ of a level corresponding to the power supply control signal CTRL from an input voltage (for example, power supply voltage $V_{CC}$ of a prescribed level). In addition, as described above, the power supply circuit 112 is not limited to employing the envelope tracking scheme and may generate the voltage $V_{REG}$ on the basis of another scheme such as the average power tracking scheme.

The power amplification module 113A amplifies the power of the RF signal ($RF_{IN}$) output from the RF unit 111 on the basis of the voltage $V_{REG}$ supplied from the power supply circuit 112 up to the level that is required to transmit the RF signal to a base station and outputs an amplified signal ($RF_{OUT}$).

The front end unit 114 filters the amplified signal ($RF_{OUT}$) and switches a reception signal received from the base station. The amplified signal output from the front end unit 114 is transmitted to the base station via the antenna 115.

Figure 2:
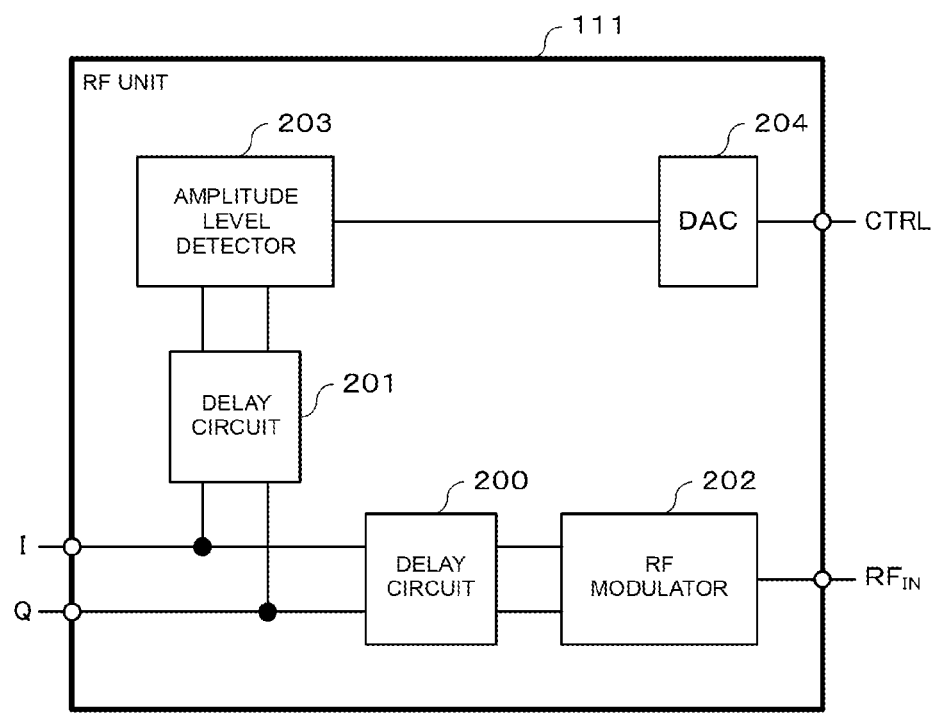
FIG. 2 illustrates an example of the configuration of an RF unit.

FIG. 2 illustrates an example of the configuration of the RF unit 111. As illustrated in FIG. 2, the RF unit 111 includes delay circuits 200 and 201, an RF modulator 202, an amplitude level detector 203 and a digital-to-analog converter (DAC) 204.

The delay circuits 200 and 201 are circuits that delay the IQ signals by a prescribed amount of time in order to make the timing at which the RF signal is inputted to the power amplification module 113A and the timing at which the voltage $V_{REG}$ corresponding to the amplitude level of the RF signal is supplied to the power amplification module 113A match each other.

The RF modulator 202 generates an RF signal from the IQ signals and then outputs the generated RF signal. Specifically, the RF modulator 202, for example, combines the I signal and a carrier signal by using a multiplier and combines the Q signal and a 90° phase-shifted carrier signal by using a multiplier and then combines these composite signals by using a subtractor, and as a result an RF signal can be obtained.

The amplitude level detector 203 detects the amplitude level of the modulated signal on the basis of the IQ signals. Here, the detected amplitude level corresponds to the amplitude level of the RF signal output from the RF modulator 202.

The DAC 204 converts the power supply control signal output from the amplitude level detector 203 into an analog signal and then outputs the analog signal.

Figure 3:
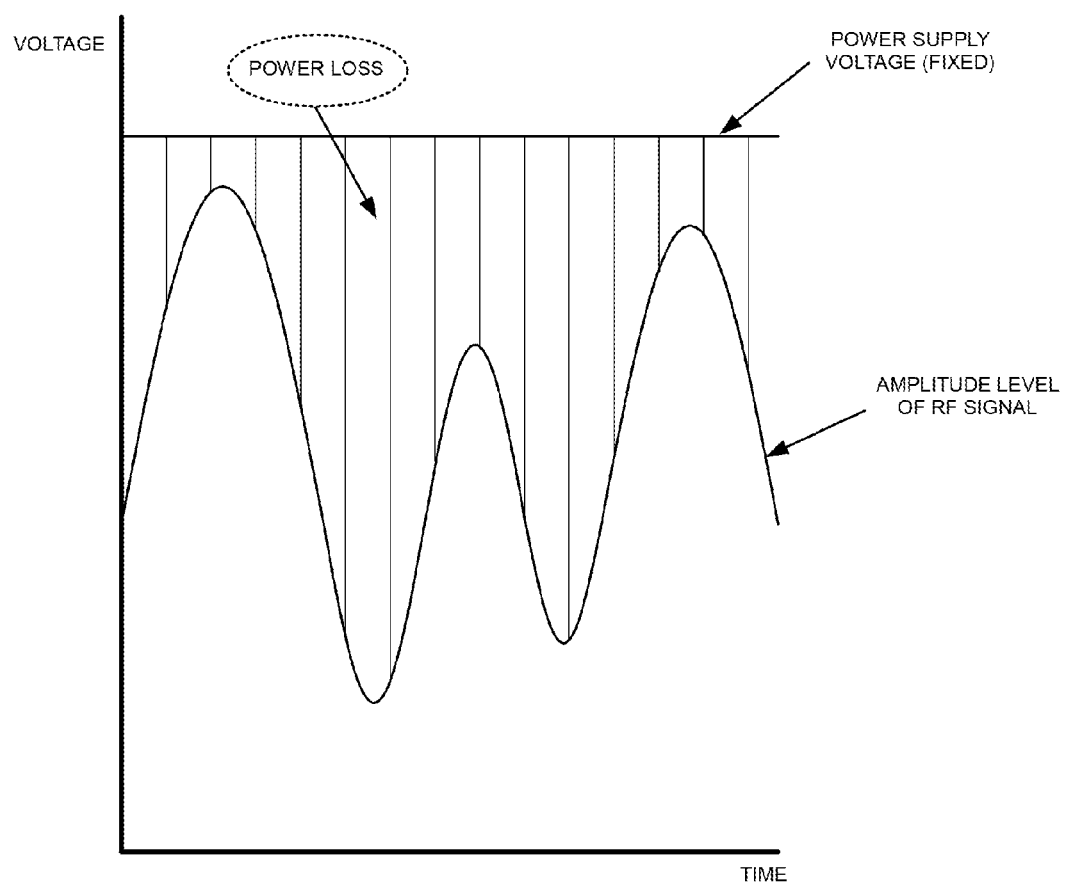
FIG. 3 illustrates an example of power loss in a case where power amplification is performed using a fixed power supply voltage.

An example of power supply voltage control using envelope tracking will be described while referring to FIGS. 3 and 4. FIG. 3 illustrates an example of power loss in a case where power amplification is performed using a fixed power supply voltage. As illustrated in FIG. 3, when a fixed power supply voltage is employed that matches the maximum level of the amplitude of the RF signal in the case where the amplitude level of the RF signal changes by a large amount, the power loss is large in the intervals where the amplitude level of the RF signal is small.

Figure 4:
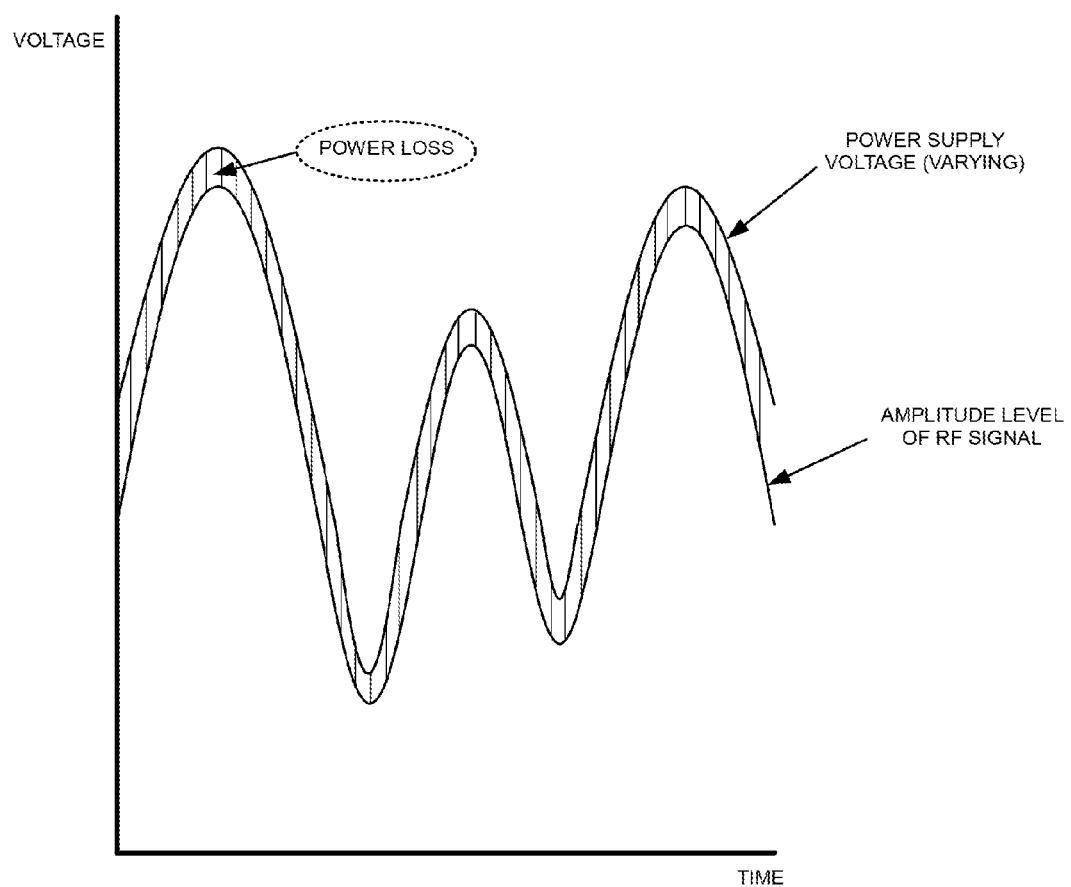
FIG. 4 illustrates an example of power loss in a case where power amplification is performed using a power supply voltage that can vary through envelope tracking.

FIG. 4 illustrates an example of power loss in a case where power amplification is performed using a power supply voltage that can vary through envelope tracking. As illustrated in FIG. 4, the power supply voltage is varied in accordance with the amplitude level of the RF signal and as a result the power loss can be reduced.

In this embodiment, on the basis of the power supply control signal CTRL output from the RF unit 111, the power supply circuit 112 controls the voltage $V_{REG}$ supplied to the power amplification module 113A to a level that corresponds to the amplitude level of the RF signal.

Figure 5:
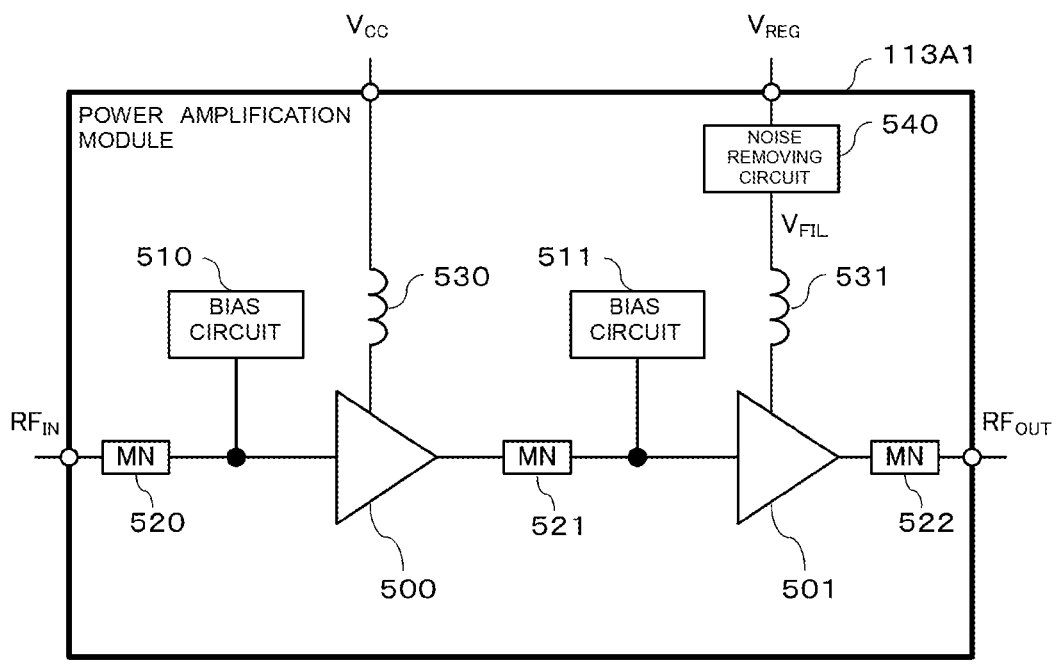
FIG. 5 illustrates an example configuration of a power amplification module.

FIG. 5 illustrates an example configuration of the power amplification module 113A. As illustrated in FIG. 5, a power amplification module 113A1 includes power amplifiers 500 and 501, bias circuits 510 and 511, matching networks 520, 521 and 522, inductors 530 and 531 and a noise removing circuit 540.

The power amplifiers 500 and 501 form a two-stage amplifier and amplify an input RF signal ($RF_{IN}$) and then output the amplified signal ($RF_{OUT}$). Each of the power amplifiers includes a bipolar transistor (for example, a heterojunction bipolar transistor) and amplifies an input signal and then outputs the amplified signal. The first stage (drive stage) power amplifier 500 (second power amplifier) outputs a signal (first signal) obtained by amplifying an input signal (third signal). The second stage (power stage) power amplifier 501 (first power amplifier) outputs a signal (second signal) obtained by amplifying a signal (first signal) output from the power amplifier 500.

The bias circuits 510 and 511 supply a bias to the power amplifiers 500 and 501, respectively.

The matching networks 520, 521 and 522 are provided in order to match the impedances between circuits. The matching networks 520, 521 and 522 are formed using inductors and capacitors, for example.

The inductors 530 and 531 are provided in order to isolate an RF signal.

The noise removing circuit 540 (first noise removing circuit) generates a voltage $V_{FIL}$ (second voltage) by removing noise from the voltage $V_{REG}$ (first voltage) supplied from the power supply circuit 112. Specifically, the noise removing circuit 540 removes noise at frequencies between the transmission and reception frequencies of the RF signals (in interval between frequency of transmission signal and frequency of reception signal). The noise removing circuit 540 removes noise from the voltage $V_{REG}$ and the value of the voltage $V_{FIL}$ is substantially the same as the value of the voltage $V_{REG}$.

In the power amplification module 113A1, a voltage $V_{CC}$ of a prescribed level is supplied as a power supply voltage to the first stage power amplifier 500. On the other hand, the voltage $V_{FIL}$ from which noise has been removed by the noise removing circuit 540 is supplied to the second stage power amplifier 501. In other words, in the power amplification module 113A1, the second stage power amplifier 501 operates using the envelope tracking scheme.

FIG. 6A illustrates an example configuration of the noise removing circuit 540. As illustrated in FIG. 6A, a noise removing circuit 540A includes an inductor 600 and a capacitor 601. The voltage $V_{REG}$ is supplied to a first terminal of the inductor 600 and a second terminal of the inductor 600 is connected to the inductor 531. A first terminal of the capacitor 601 is connected to the second terminal of the inductor 600 and a second terminal of the capacitor 601 is connected to ground. With this connection configuration, the inductor 600 and the capacitor 601 form a low pass filter (LPF). Thus, the noise removing circuit 540A outputs a power supply voltage $V_{FIL}$ that is obtained by removing the noise from the voltage $V_{REG}$. In the noise removing circuit 540A, for example, the inductor 600 and the capacitor 601 are selected such that the LPF cutoff frequency is lower than the interval between the transmission and reception frequencies of the RF signals.

Figure 6B:
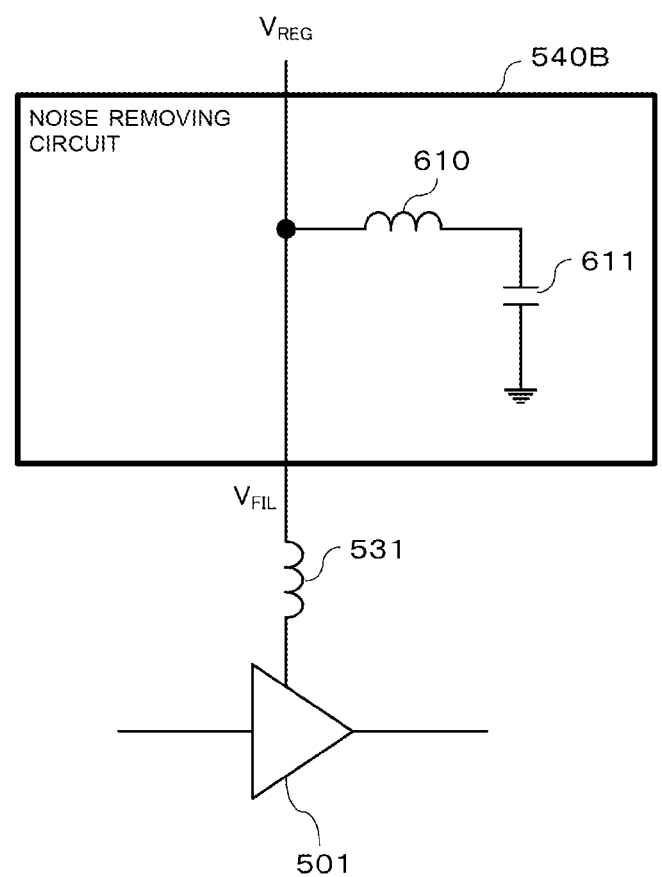
FIG. 6B illustrates another example configuration of the noise removing circuit.

FIG. 6B illustrates another example configuration of the noise removing circuit 540. As illustrated in FIG. 6B, a noise removing circuit 540B includes an inductor 610 and a capacitor 611. The voltage $V_{REG}$ is supplied to a first terminal of the inductor 610 and a second terminal of the inductor 610 is connected to a first terminal of the capacitor 611. A first terminal of the capacitor 611 is connected to the second terminal of the inductor 610 and a second terminal of the capacitor 611 is connected to ground. With this connection configuration, the inductor 610 and the capacitor 611 are connected as an LC series resonant circuit and therefore form a band elimination filter (BEF). Thus, the noise removing circuit 540B outputs a power supply voltage $V_{FIL}$ that is obtained by removing the noise from the voltage $V_{REG}$. In the noise removing circuit 540B, for example, the inductor 600 and the capacitor 601 are selected such that the interval between the transmission and reception frequencies of the RF signals is included in the BEF elimination frequency band. At this time, the Q values and component values of the inductor 610 and the capacitor 611 are adjusted in order that a wide frequency band or only a specific frequency can be attenuated.

Figure 6C:
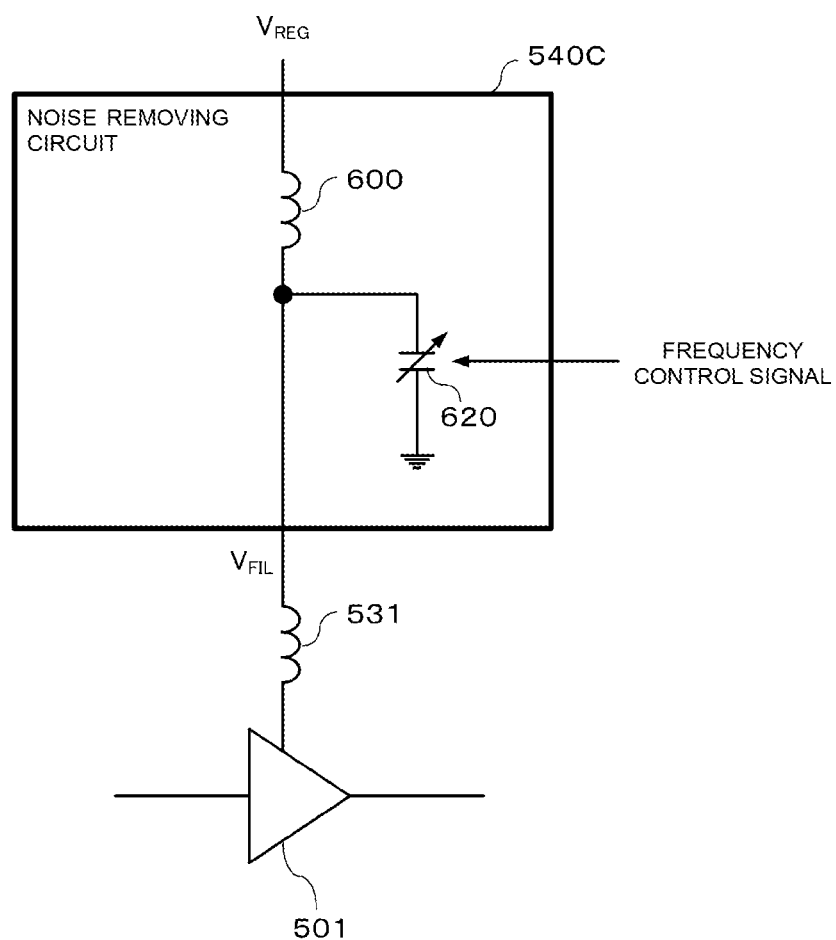
FIG. 6C illustrates another example configuration of the noise removing circuit.

FIG. 6C illustrates another example configuration of the noise removing circuit 540. A noise removing circuit 540C illustrated in FIG. 6C is the same as the noise removing circuit 540A except that the capacitor 601 of the noise removing circuit 540A illustrated in FIG. 6A is replaced with a capacitor 620. Consistent components that are the same as those of the noise removing circuit 540A are denoted by the same symbols and description thereof is omitted. The capacitor 620 is a variable capacitor that is able to vary its capacitance in accordance with a frequency control signal. Therefore, in the noise removing circuit 540C, the LPF cutoff frequency can be adjusted by varying the capacitance of the capacitor 620.

Figure 6D:
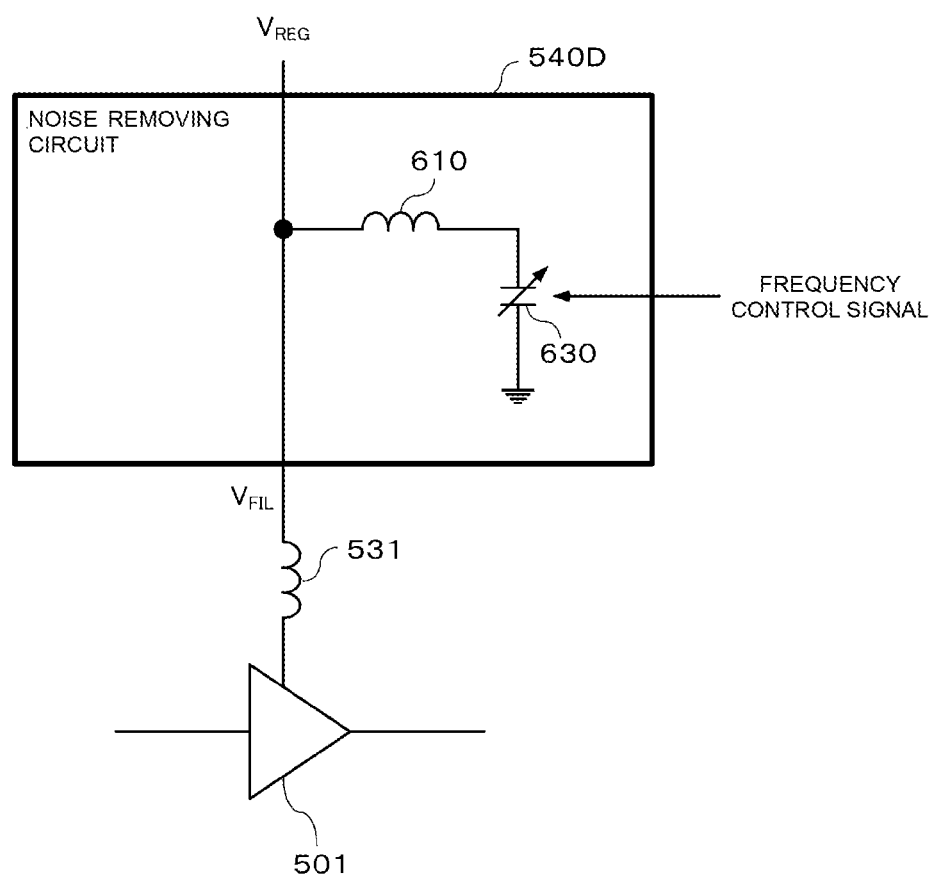
FIG. 6D illustrates another example configuration of the noise removing circuit.

FIG. 6D illustrates another example configuration of the noise removing circuit 540. A noise removing circuit 540D illustrated in FIG. 6D is the same as the noise removing circuit 540B except that the capacitor 611 of the noise removing circuit 540B illustrated in FIG. 6B is replaced with a capacitor 630. Consistent components that are the same as those of the noise removing circuit 540B are denoted by the same symbols and description thereof is omitted. The capacitor 630 is a variable capacitor that is able to vary its capacitance in accordance with a frequency control signal. Therefore, in the noise removing circuit 540D, the BEF elimination frequency can be adjusted by varying the capacitance of the capacitor 630.

Next, the reception band noise characteristics of the power amplification module are investigated. The reception band noise level when the power amplification module is made to operate using a normal scheme (average power following mode), rather than the envelope tracking scheme, is around −135 dBm/Hz in Band 5 (824 to 849 MHz).

A reception band noise level P when the power amplification module is made to operate using the envelope tracking scheme is $P=P_{ET} \times G + P_{PA}$ in a case where noise removal for the power supply circuit is not considered, where $P_{ET}$ represents the noise level at a frequency between the transmission and reception frequencies in an envelope tracking power supply circuit, $P_{PA}$ represents a reception band noise level in the power amplification module and G represents a conversion gain of the power amplification module.

For example, when $P_{ET}$=−130 dBm/Hz, $P_{PA}$=−135 dBm/Hz and G=−3 dB, P=−130.88 dBm/Hz. Therefore, compared with the normal scheme, the reception band noise level is degraded by around 4 dB/Hz.

In the power amplification module 113A1, noise is removed from the voltage $V_{REG}$ by the noise removing circuit 540. For example, assuming that $P_{ET}$ is reduced by 10 dB by the noise removing circuit 540, P=−134.36 dBm/Hz. Therefore, the degradation of the reception band noise level is improved by around 0.5 dBm/Hz from the case of the normal scheme.

Thus, the degradation of the reception band noise characteristics in the power amplification module 113A1 can be suppressed by removing noise from the power supply voltage $V_{REG}$ by using the noise removing circuit 540.

Figure 7:
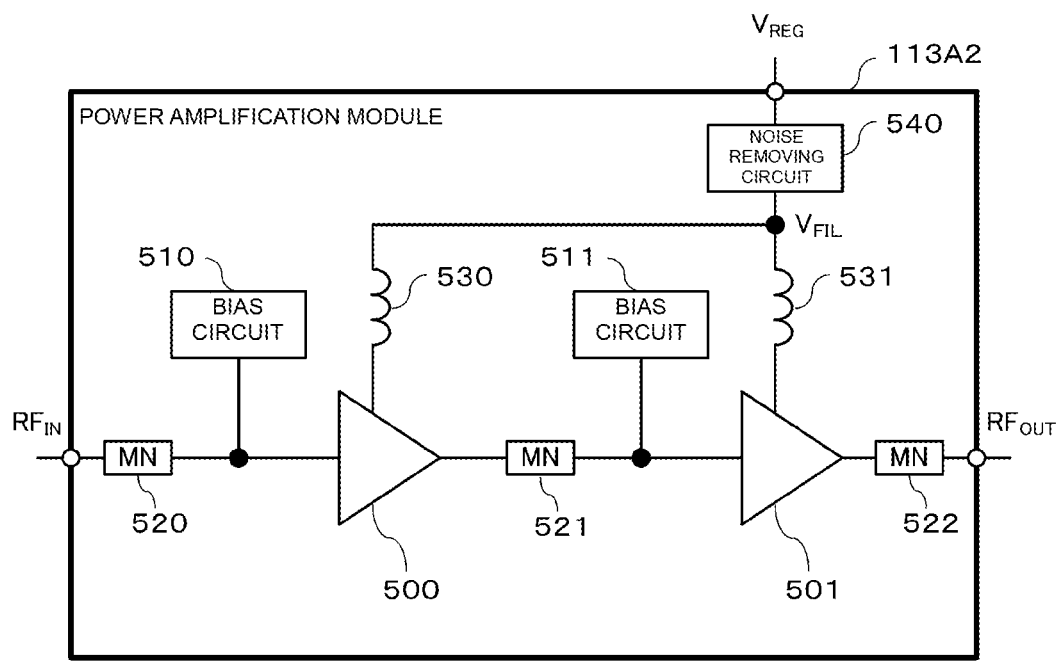
FIG. 7 illustrates another example configuration of the power amplification module.

FIG. 7 illustrates another example configuration of the power amplification module 113A. A power amplification module 113A2 has the same configuration as the power amplification module 113A1 illustrated in FIG. 5 except that the voltage $V_{FIL}$ output from the noise removing circuit 540 is also supplied to the first stage power amplifier 500. Consistent components that are the same as those of the power amplification module 113A1 are denoted by the same symbols and description thereof is omitted.

In the power amplification module 113A2, the voltage $V_{FIL}$ from which noise has been removed by the noise removing circuit 540 is supplied to both the first stage power amplifier 500 and the second stage power amplifier 501. In other words, in the power amplification module 113A2, both of the power amplifiers 500 and 501 operate using the envelope tracking scheme.

Similarly to as in the power amplification module 113A1, the degradation of the reception band noise characteristics can be suppressed in the power amplification module 113A2 as well by removing noise from the voltage $V_{REG}$ by using the noise removing circuit 540.

Figure 8:
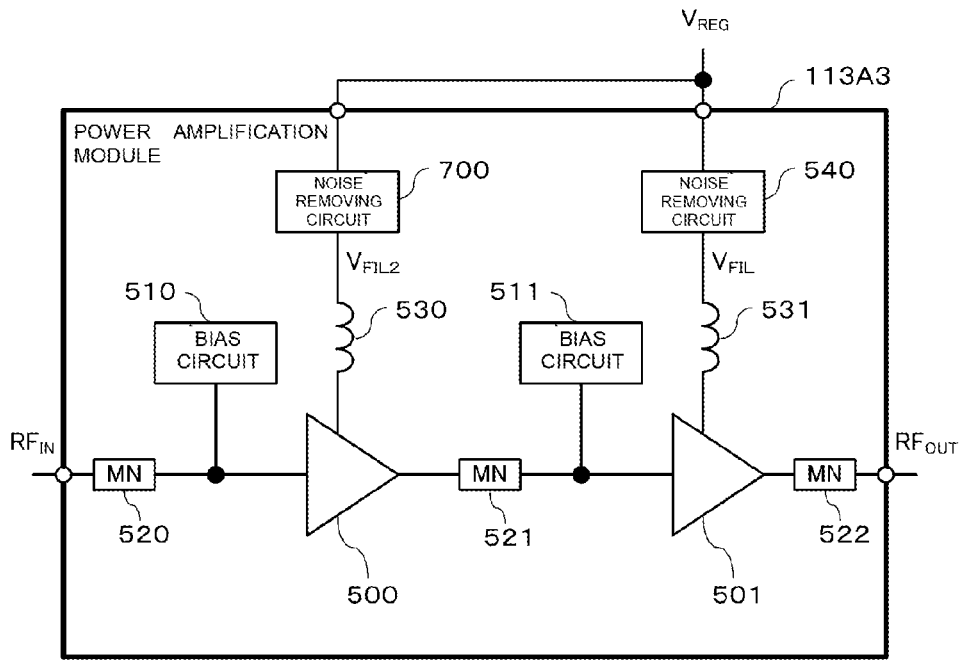
FIG. 8 illustrates another example configuration of the power amplification module.

FIG. 8 illustrates another example configuration of the power amplification module 113A. A power amplification module 113A3 has the same configuration as the power amplification module 113A2 illustrated in FIG. 7 except that a noise removing circuit 700 is additionally provided. Consistent components that are the same as those of the power amplification module 113A2 are denoted by the same symbols and description thereof is omitted.

The noise removing circuit 700 (second noise removing circuit) generates a voltage $V_{FIL2}$ (third voltage) by removing noise from the voltage $V_{REG}$ (first voltage), similarly to the noise removing circuit 540. The configuration of the noise removing circuit 700 is the same as that of the noise removing circuit 540 and therefore description thereof is omitted.

In the power amplification module 113A3, the voltage $V_{FIL2}$ from which noise has been removed by the noise removing circuit 700 is supplied to the first stage power amplifier 500. In addition, the voltage $V_{FIL}$ from which noise has been removed by the noise removing circuit 540 is supplied to the second stage power amplifier 501. In other words, in the power amplification module 113A3, both of the power amplifiers 500 and 501 operate using the envelope tracking scheme.

Similarly to as in the power amplification module 113A2, the degradation of the reception band noise characteristics can be suppressed in the power amplification module 113A3 as well by removing noise from the voltage $V_{REG}$ by using the noise removing circuits 540 and 700. In addition, in the power amplification module 113A3, noise removing circuits are individually provided for the first stage and the second stage. Thus, the noise removal characteristics can be adjusted in accordance with the characteristics of each stage.

Figure 9:
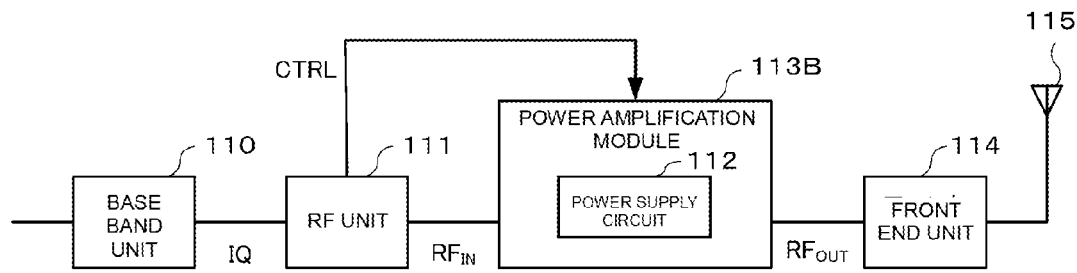
FIG. 9 illustrates another example configuration of a transmission unit.

FIG. 9 illustrates another example configuration of a transmission unit. A transmission unit 100B has the same configuration as the transmission unit 100A except that the transmission unit 100B includes a power amplification module 113B instead of the power amplification module 113A illustrated in FIG. 1. Constituent components that are the same as those of the transmission unit 100A are denoted by the same symbols and description thereof is omitted.

Figure 10:
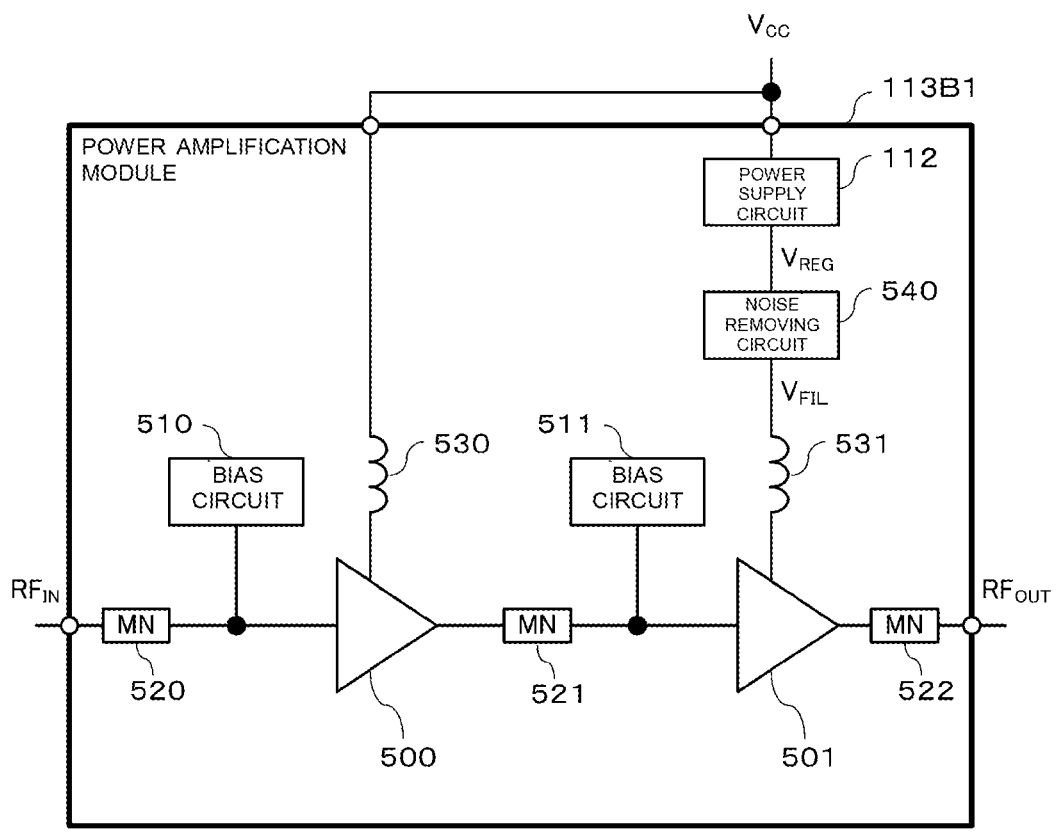
FIG. 10 illustrates an example configuration of a power amplification module.

The power supply circuit 112 is built into the power amplification module 113B. FIG. 10 illustrates an example configuration of the power amplification module 113B. A power amplification module 113B1 has the same configuration as the power amplification module 113A1 illustrated in FIG. 5 except that the power supply circuit 112 is built into the power amplification module 113B1. Consistent components that are the same as those of the power amplification module 113A1 are denoted by the same symbols and description thereof is omitted.

In the power amplification module 113B1 having the built-in envelope tracking power supply circuit, the distance between the power supply circuit and the power amplifiers is small and the effect of voltage reduction due to wiring lines and so forth can be reduced. Furthermore, since the power amplifiers and the power supply circuit can be connected to each other at the shortest possible distance, it is possible to reduce the size of the layout and suppress radiation noise from wiring sections and so forth.

Figure 11:
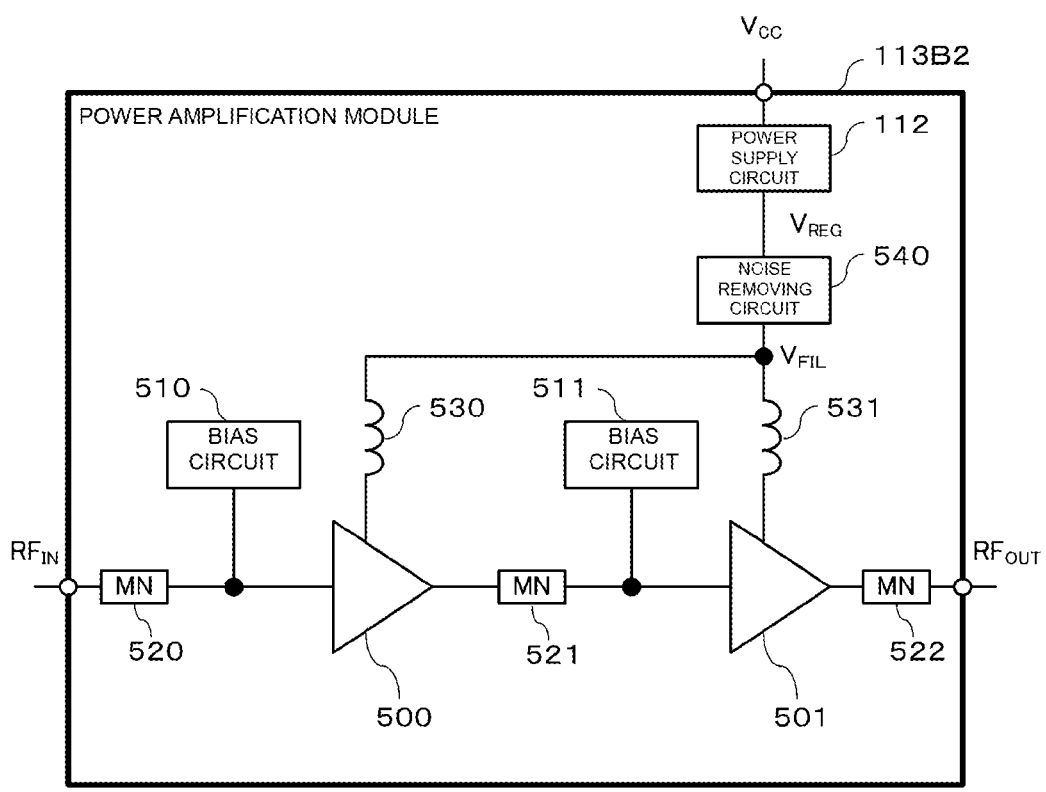
FIG. 11 illustrates another example configuration of the power amplification module.

FIG. 11 illustrates another example configuration of the power amplification module 113B. A power amplification module 113B2 has the same configuration as the power amplification module 113A2 illustrated in FIG. 7 except that the power supply circuit 112 is built into the power amplification module 113B2. Consistent components that are the same as those of the power amplification module 113A2 are denoted by the same symbols and description thereof is omitted.

Similarly to as in the power amplification module 113A2, the degradation of the reception band noise characteristics can be suppressed in the power amplification module 113B2 as well by removing noise from the voltage $V_{REG}$ by using the noise removing circuit 540.

Figure 12:
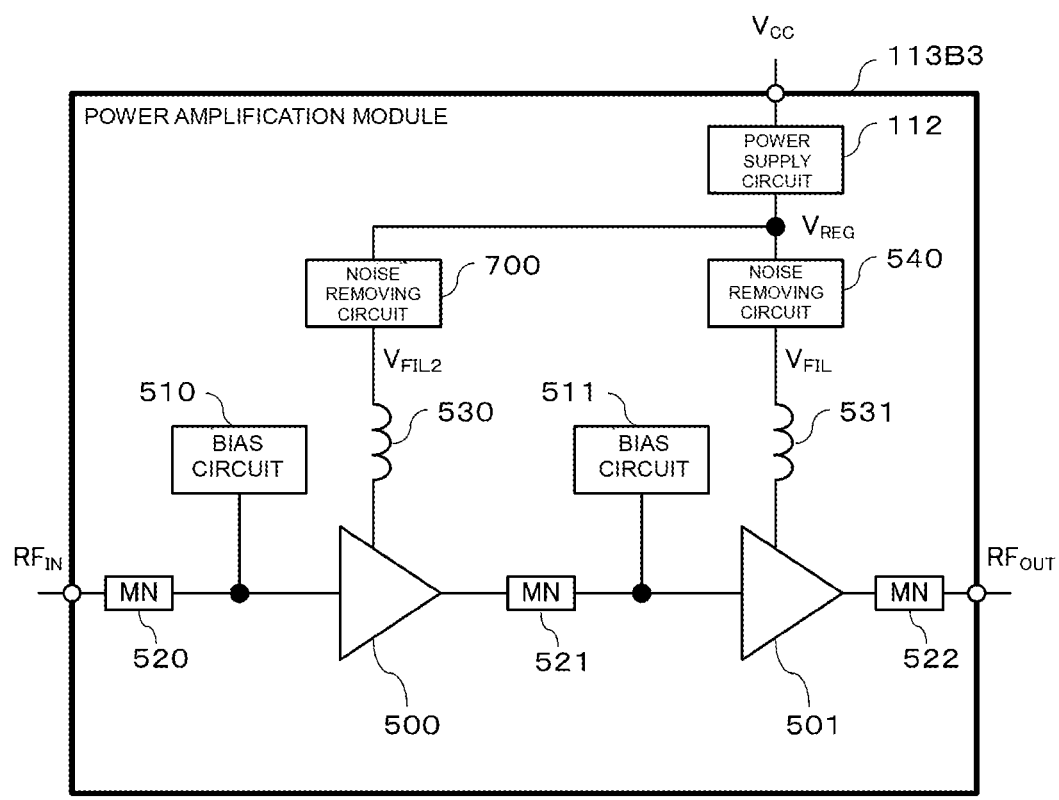
FIG. 12 illustrates another example configuration of the power amplification module.

FIG. 12 illustrates another example configuration of the power amplification module 113B. A power amplification module 113B3 has the same configuration as the power amplification module 113A3 illustrated in FIG. 8 except that the power supply circuit 112 is built into the power amplification module 113B3. Consistent components that are the same as those of the power amplification module 113A3 are denoted by the same symbols and description thereof is omitted.

Similarly to as in the power amplification module 113A3, the degradation of the reception band noise characteristics can be suppressed in the power amplification module 113B3 as well by removing noise from the voltage $V_{REG}$ by using the noise removing circuit 540.

Figure 13:
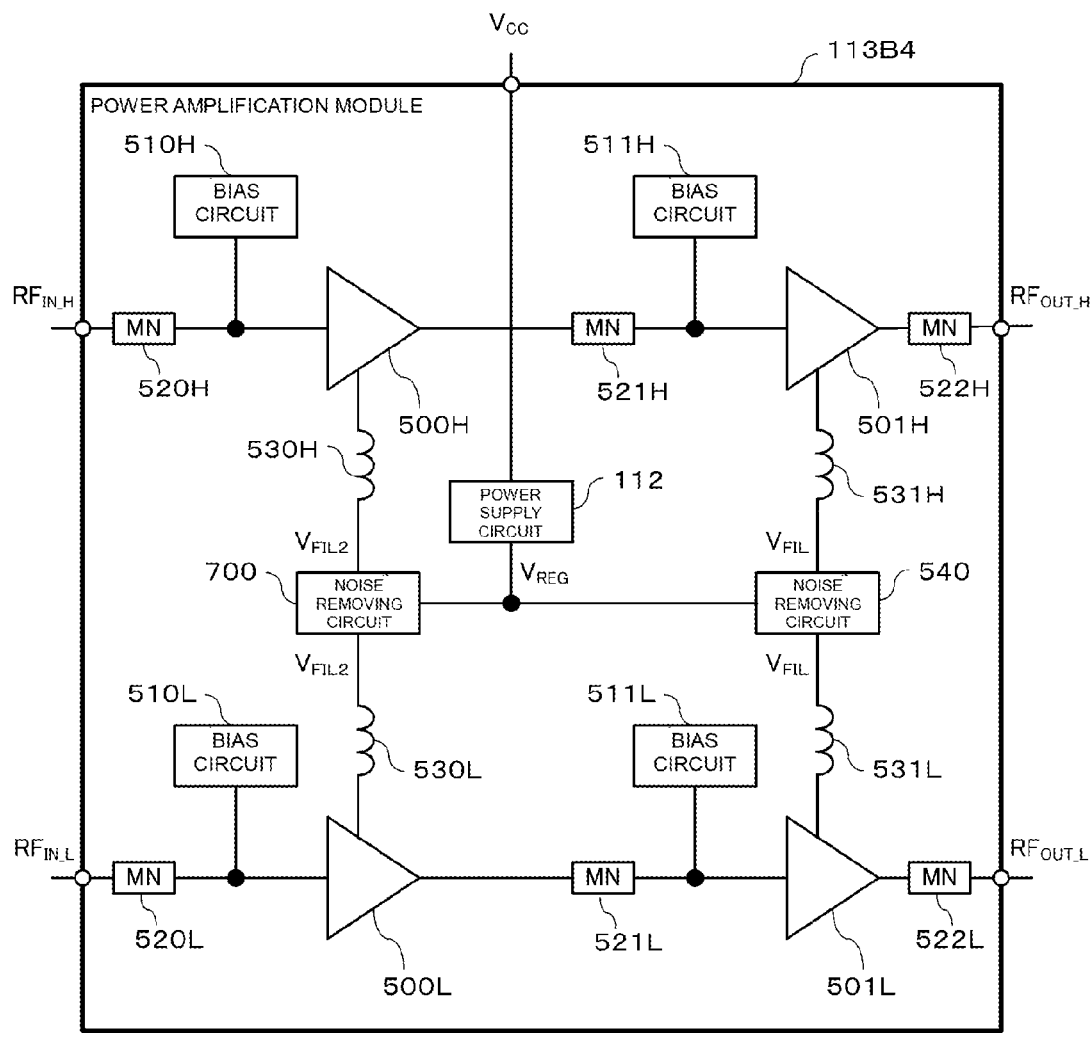
FIG. 13 illustrates another example configuration of the power amplification module.

FIG. 13 illustrates another example configuration of the power amplification module 113B. Constituent elements that are the same as those of the power amplification module 113B3 illustrated in FIG. 12 are denoted by the same symbols and description thereof is omitted.

A power amplification module 113B4 supports a first frequency band (high band) and a second frequency band (low band). Specifically, power amplifiers 500H and 501H form a high-band power amplifier. The first stage power amplifier 500H (second power amplifier) outputs a signal (first signal) obtained by amplifying a high-band input signal (third signal). The second stage power amplifier 501H (first power amplifier) outputs a signal (second signal) obtained by amplifying a signal (first signal) output from the power amplifier 500H. In addition, power amplifiers 500L and 501L form a low-band power amplifier. The first stage power amplifier 500L (fourth power amplifier) outputs a signal (fourth signal) obtained by amplifying a low-band input signal (sixth signal). The second stage power amplifier 501L (third power amplifier) outputs a signal (fifth signal) obtained by amplifying a signal (fourth signal) output from the power amplifier 500L.

In the power amplification module 113B4, the voltage $V_{FIL2}$ from which noise has been removed by the noise removing circuit 700 is supplied to the first stage power amplifiers 500H and 500L. In addition, the voltage $V_{FIL}$ from which noise has been removed by the noise removing circuit 540 is supplied to the second stage power amplifiers 501H and 501L. In other words, in the power amplification module 113B4, the power amplifiers 500H, 500L, 501H and 501L all operate using the envelope tracking scheme.

Similarly to as in the power amplification module 113B3, the degradation of the reception band noise characteristics can be suppressed in the power amplification module 113B4 as well by removing noise from the voltage $V_{REG}$ by using the noise removing circuits 540 and 700. In addition, in the power amplification module 113B4, it is possible to suppress an increase in cost by using the noise removing circuits 700 and 540 for both the high band and the low band.

Figure 14:
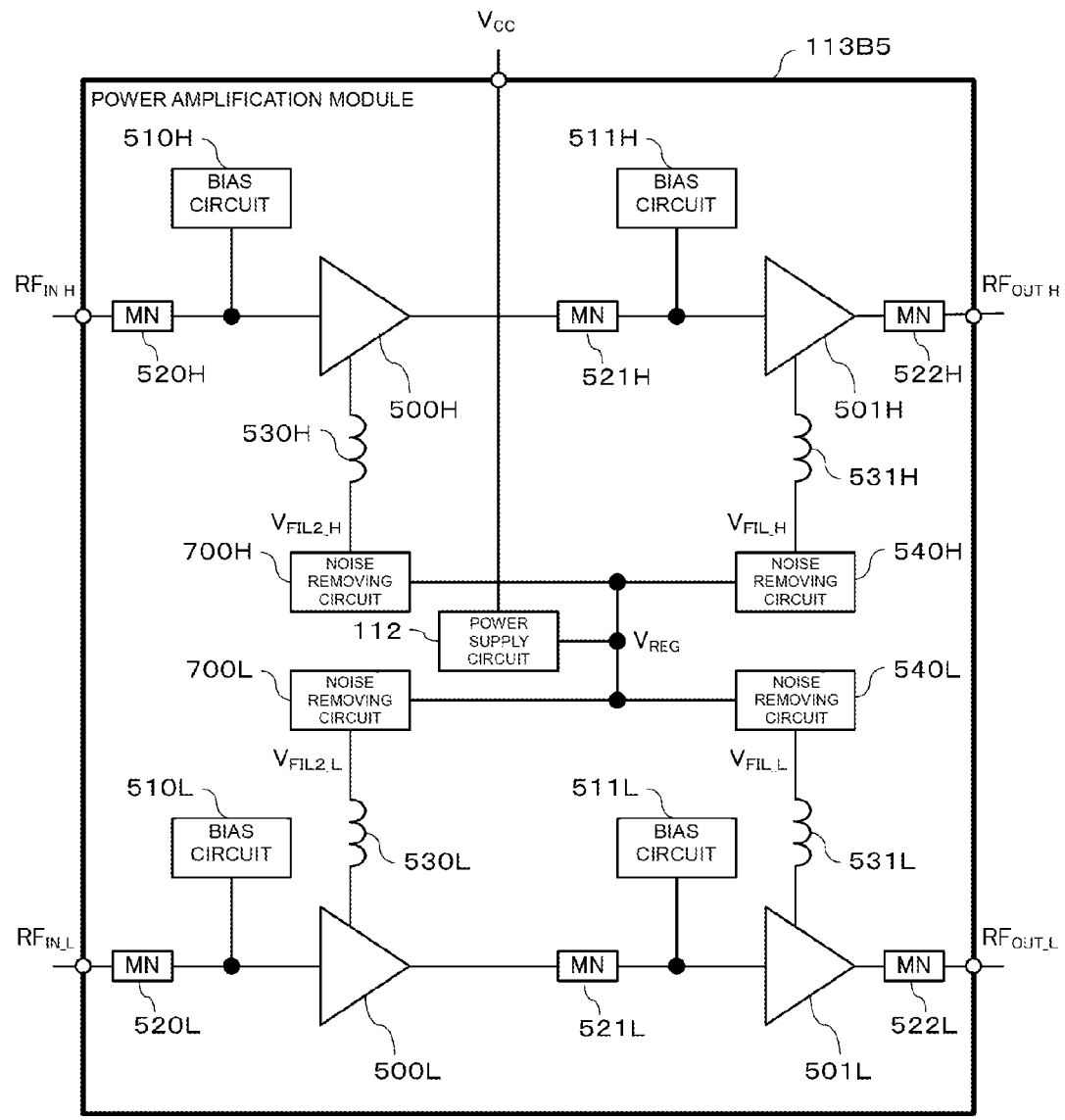
FIG. 14 illustrates another example configuration of the power amplification module.

FIG. 14 illustrates another example configuration of the power amplification module 113B. Constituent elements that are the same as those of the power amplification module 113B4 illustrated in FIG. 13 are denoted by the same symbols and description thereof is omitted.

A power amplification module 113B5 handles a first frequency band (high band) and a second frequency band (low band), similarly to the power amplification module 113B4.

In the power amplification module 113B5, noise removing circuits are separately provided for the high band and the low band. Specifically, a power supply voltage $V_{FIL2H}$ from which noise has been removed by a noise removing circuit 700H is supplied to a high-band first stage power amplifier 500H. In addition, a power supply voltage $V_{FIL\_H}$ from which noise has been removed by a noise removing circuit 540H is supplied to a high-band second stage power amplifier 501H. A power supply voltage $V_{FIL2\_L}$ from which noise has been removed by a noise removing circuit 700L is supplied to a low-band first stage power amplifier 500L. A power supply voltage $V_{FIL\_L}$ from which noise has been removed by a noise removing circuit 540L is supplied to a low-band second stage power amplifier 501L.

Similarly to as in the power amplification module 113B4, the degradation of the reception band noise characteristics can be suppressed in the power amplification module 113B5 as well by removing noise from the voltage $V_{REG}$ by using the noise removing circuits 540H, 540L, 700H and 700L. In addition, by separately providing noise removing circuits for the high band and the low band in the power amplification module 113B5, noise removal that is appropriate for the respective bands can be performed.

Figure 15:
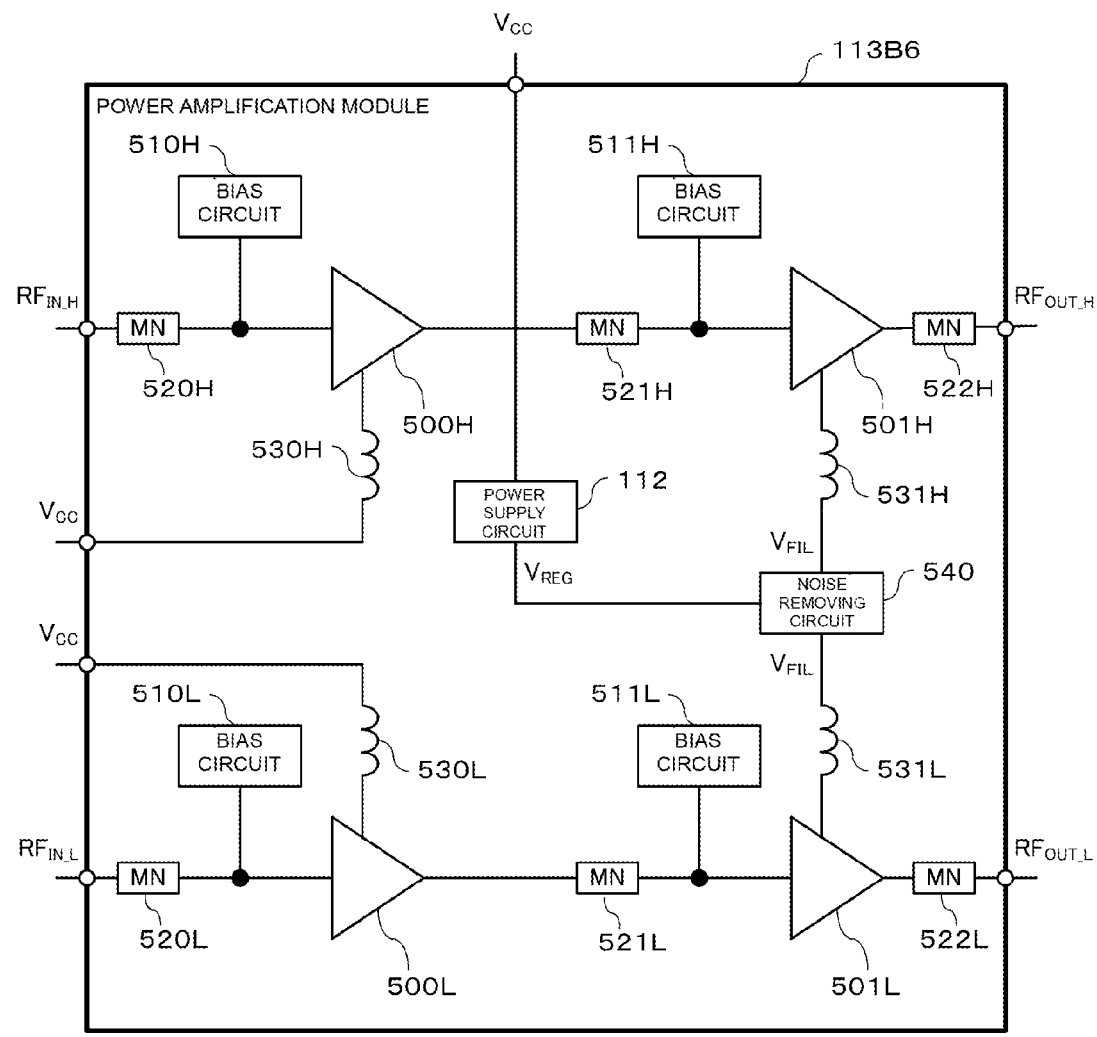
FIG. 15 illustrates another example configuration of the power amplification module.

FIG. 15 illustrates another example configuration of the power amplification module 113B. Constituent elements that are the same as those of the power amplification module 113B4 illustrated in FIG. 13 are denoted by the same symbols and description thereof is omitted.

In a power amplification module 113B6, different from the power amplification module 113B4, only the second stage power amplifiers operate using the envelope tracking scheme. Specifically, a voltage $V_{FIL}$ obtained by removing noise from the voltage $V_{REG}$ is supplied second-stage power amplifiers 501H and 501L, whereas a voltage $V_{CC}$ is supplied to first-stage power amplifiers 500H and 500L.

Similarly to as in the power amplification module 113B4, the degradation of the reception band noise characteristics can be suppressed in the power amplification module 113B6 as well by removing noise from the voltage $V_{REG}$ by using the noise removing circuit 540. A configuration in which only the second stage power amplifiers operate using the envelope tracking scheme can be adopted in the power amplification module 113B5 illustrated in FIG. 14 as well.

Exemplary embodiments of the present disclosure have been described above. According to the power amplification modules 113A1 to 113A3 and 113B1 to 113B3, a voltage $V_{FIL}$ obtained by removing noise from a voltage $V_{REG}$ that varies in accordance with the amplitude of an RF signal is supplied as the power supply voltage of the power amplifier 501. Thus, the degradation of reception band noise characteristics can be suppressed in an envelope-tracking-scheme power amplification module. Although the case of power amplification modules that employ the envelope tracking scheme has been described in this embodiment, the same effect can be obtained for power amplification modules that employ other schemes in which the power supply voltage varies such as an average power tracking scheme.

The power amplification modules 113A1 to 113A3 and 113B1 to 113B3 are formed with a two-stage amplifier, but the number of stages of the power amplifier is not limited to two and may be one or three or more.

In addition, in the power amplification modules 113B1 to 113B3, the voltage $V_{FIL}$, which is obtained by removing noise from the voltage $V_{REG}$, is supplied as the power supply voltage of the power amplifier 501 in a configuration where the power supply circuit 112 that generates the voltage $V_{REG}$ is built into the power amplification module.

Furthermore, in the power amplification modules 113A1 to 113A3 and 113B1 to 113B3, a configuration can be adopted in which it is possible to adjust the frequency at which noise removal is performed as exemplified in FIGS. 6C and 6D. Thus, the frequency at which noise removal is performed can be adjusted in accordance with the transmission/reception frequency interval of the use frequencies in the case where multiple bands are supported.

In addition, the degradation of reception band noise characteristics can be suppressed by supplying the voltage $V_{FIL}$, which is obtained by removing noise from the voltage $V_{REG}$, to the power amplifier 501 in a configuration in which a two-stage power amplifier is provided, as in the power amplification modules 113A1 to 113A3 and 113B1 to 113B3.

The degradation of reception band noise characteristics can be suppressed by supplying the voltage $V_{FIL}$, which is obtained by removing noise from the voltage $V_{REG}$, to a first-stage (drive stage) power amplifier 500, as illustrated in the power amplification modules 113A2 and 113B2.

Furthermore, a noise removing circuit 700 that supplies a voltage $V_{FIL2}$ obtained by removing noise from the voltage $V_{REG}$ to a first-stage power amplifier 500 can be provided as illustrated in the power amplification module 113A3 and 113B3. Thus, the noise removal characteristics can be adjusted in accordance with the characteristics of each stage.

Furthermore, the degradation of the reception band noise characteristics can be suppressed by removing noise from the voltage $V_{REG}$ by using noise removing circuits 540 and 700, similarly to as in the power amplification module 113B3, also in a configuration in which high-band power amplifiers 500H and 501H and low-band power amplifiers 500L and 501L are provided, as in the power amplification module 113B4. In addition, in the power amplification module 113B4, it is possible to suppress an increase in cost by using the noise removing circuits 700 and 540 for both the high band and the low band.

Furthermore, similarly to as in the power amplification module 113B4, the degradation of the reception band noise characteristics can be suppressed by removing noise from the voltage $V_{REG}$ by using noise removing circuits 540H, 540L, 700H and 700L in a configuration in which high-band power amplifiers 500H and 501H and low-band power amplifiers 500L and 501L are provided, as in the power amplification module 113B5. In addition, by separately providing noise removing circuits for the high band and the low band in the power amplification module 113B5, noise removal that is appropriate for the respective bands can be performed.

Although two frequency bands, namely, a high band and a low band, are used in the power amplification modules 113B4 and 113B5, the number of frequency bands is not limited to two and three or more frequency bands may be used.

The purpose of the embodiments described above is to enable easy understanding of the present disclosure and the embodiments are not to be interpreted as limiting the present disclosure. The present disclosure can be modified or improved without departing from the gist of the disclosure and equivalents to the present disclosure are also included in the present invention. In other words, those skilled in the art can make appropriate design modifications to the embodiments, and such modifications are included in the scope of the present disclosure so long as the modifications have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising:
    a first power amplifier amplifying a first signal and outputting a second signal;
    a second power amplifier amplifying a third signal and outputting the first signal; and
    a first noise removing circuit inputted with a first voltage supplied from a DC-DC converter, the first noise removing circuit removing noise from the first voltage in order to generate a second voltage, and outputting the second voltage as a power supply voltage of the first power amplifier and the second power amplifier, the first noise removing circuit comprising:
        a first inductor; and
        a first capacitor,
        wherein a first terminal of the first inductor is supplied with the first voltage, a second terminal of the first inductor is connected to a second inductor and to a first terminal of the first capacitor, and a second terminal of the first capacitor is connected to ground, and
        wherein the first inductor and the first capacitor form a low pass filter, a cutoff frequency of the low pass filter being less than a transmission frequency and a reception frequency of the power amplification module.

2. The power amplification module according to claim 1, wherein the first voltage varies in accordance with an amplitude of the first signal.

3. The power amplification module according to claim 1, wherein the first voltage varies in accordance with an average output power of the power amplification module.

4. The power amplification module according to claim 1, wherein the DC-DC converter is built into the power amplification module.

5. The power amplification module according to claim 1, wherein the first noise removing circuit adjusts a frequency at which noise removal is performed in accordance with a frequency control signal.

6. The power amplification module according to claim 2, wherein the DC-DC converter is built into the power amplification module.

7. The power amplification module according to claim 3, wherein the DC-DC converter is built into the power amplification module.

8. The power amplification module according to claim 2, wherein the first noise removing circuit adjusts a frequency at which noise removal is performed in accordance with a frequency control signal.

9. The power amplification module according to claim 3, wherein the first noise removing circuit adjusts a frequency at which noise removal is performed in accordance with a frequency control signal.

10. The power amplification module according to claim 4, wherein the first noise removing circuit adjusts a frequency at which noise removal is performed in accordance with a frequency control signal.

* * * * *

UNITED STATES PATENT AND TRADEMARK OFFICE
CERTIFICATE OF CORRECTION

PATENT NO. : 9,899,963 B2  
APPLICATION NO. : 15/079960  
DATED : February 20, 2018  
INVENTOR(S) : Tsuyoshi Sato et al.

Page 1 of 1

It is certified that error appears in the above-identified patent and that said Letters Patent is hereby corrected as shown below:

In the Specification

Column 9, Line 14, replace "$V_{FIL2H}$" with -- $V_{FIL2\_H}$ --.

Signed and Sealed this  
Fifth Day of June, 2018

Andrei Iancu  
*Director of the United States Patent and Trademark Office*